(12) United States Patent
Gallagher et al.

(10) Patent No.: US 7,697,045 B2
(45) Date of Patent: Apr. 13, 2010

(54) METHOD AND APPARATUS TO EXTEND THE EFFECTIVE DYNAMIC RANGE OF AN IMAGE SENSING DEVICE

(75) Inventors: Andrew C. Gallagher, Brockport, NY (US); David N Nichols, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 12/560,814

(22) Filed: Sep. 16, 2009

(65) Prior Publication Data

US 2010/0002119 A1 Jan. 7, 2010

Related U.S. Application Data

(60) Division of application No. 10/946,919, filed on Sep. 22, 2004, now Pat. No. 7,623,168, which is a continuation-in-part of application No. 09/615,398, filed on Jul. 13, 2000, now Pat. No. 6,909,461.

(51) Int. Cl.
*H04N 5/335* (2006.01)
*H04N 3/14* (2006.01)

(52) U.S. Cl. .................. 348/275; 348/298; 348/302

(58) Field of Classification Search .............. 348/275, 348/298, 302
See application file for complete search history.

(56) References Cited

U.S. PATENT DOCUMENTS

| | | | |
|---|---|---|---|
| 3,971,065 A | 7/1976 | Bayer | |
| 4,667,092 A | 5/1987 | Ishihara | |
| 5,012,333 A | 4/1991 | Lee et al. | |
| 5,051,770 A | 9/1991 | Cornuejols | |
| 5,420,635 A | 5/1995 | Konishi et al. | |
| 5,541,705 A | 7/1996 | Kan et al. | |
| 5,652,621 A | 7/1997 | Adams, Jr. et al. | |
| 5,714,753 A | 2/1998 | Park | |
| 5,801,773 A | 9/1998 | Ikeda | |

(Continued)

FOREIGN PATENT DOCUMENTS

EP 0713 342 A 5/1996

(Continued)

OTHER PUBLICATIONS

Shree K. Mayar et al.; "High Dynamic Range Imaging: Spatially Varying Pixel Exposures"; Proceedings IEEE Conference on Computer Vision and Pattern Recognition, Hilton Head Island, South Carolina, Jun. 13-15, 2000; vol. 1, IEE Computer Society, Los Alamitos, California; pp. 472-479.

(Continued)

*Primary Examiner*—James M Hannett
(74) *Attorney, Agent, or Firm*—Justin D. Petruzzelli

(57) ABSTRACT

An image sensor generates an image signal with a differential response to image light. The image sensor has an array of photosites divided into standard photosites and non-standard photosites. A limiter provides the standard photosites with a predetermined standard response to a light exposure and the non-standard photosites with a predetermined slower response to the same light exposure. The standard photosites and nonstandard photosites both sparsely sample the array in a predetermined pattern.

5 Claims, 10 Drawing Sheets

U.S. PATENT DOCUMENTS

| | | |
|---|---|---|
| 5,838,373 A | 11/1998 | Hasegawa et al. |
| 6,040,858 A | 3/2000 | Ikeda |
| 6,083,429 A | 7/2000 | Wester |
| 6,122,109 A | 9/2000 | Peake et al. |
| 6,137,634 A | 10/2000 | Li |
| 6,163,407 A | 12/2000 | Okazaki et al. |
| 6,201,617 B1 | 3/2001 | Kusaka |
| 6,300,612 B1 | 10/2001 | Yu |
| 6,831,692 B1 | 12/2004 | Oda |
| 7,420,607 B2 | 9/2008 | Ota et al. |
| 2003/0052976 A1 | 3/2003 | Harada et al. |
| 2003/0223532 A1 | 12/2003 | Clinthorne et al. |
| 2005/0139845 A1 | 6/2005 | Shizukuishi |
| 2007/0035646 A1 | 2/2007 | Mihara et al. |

FOREIGN PATENT DOCUMENTS

| | | |
|---|---|---|
| EP | 1 209 919 A2 | 5/2002 |
| WO | 00/79784 A1 | 12/2000 |

OTHER PUBLICATIONS

Patent Abstracts of Japan vol. 2000, No. 7, Sep. 29, 2000 and JP 2000 125209A (Fuji Photo Film Co. Ltd.), Apr. 28, 2000 abstract.

Patent Abstracts of Japan, vol. 2000, No. 14, Mar. 5, 2001 & JP 2000 316163A (Olympus Optical Co. Ltd.); Nov. 14, 2000, abstract.

Patent Abstracts of Japan, vol. 2000, No. 07, Sep. 29, 2000 & JP 2000 125209 A (Fuji Photo Film Co. Ltd.); Apr. 28, 2000, abstract.

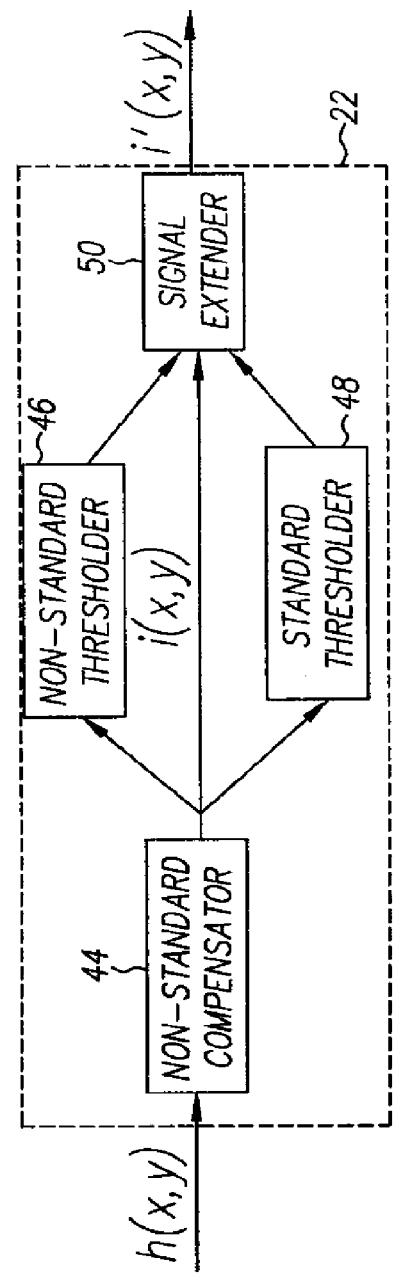

|   | 0 | 1 | 2 | 3 | y | | | | | | | | | | | |
|---|---|---|---|---|---|---|---|---|---|---|---|---|---|---|---|---|
| 0 | g* | r | g* | r* | g* | r | g* | r* | g* | r | g* | r* | g* | r | g* | r* |
| 1 | b* | g | b | g | b* | g | b | g | b* | g | b | g | b* | g | b | g |
| 2 | g* | r* | g* | r | g* | r* | g* | r | g* | r* | g* | r | g* | r* | g* | r |
| 3 | b | g | b* | g | b | g | b* | g | b | g | b* | g | b | g | b* | g |
| x | g* | r | g* | r* | g* | r | g* | r* | g* | r | g* | r* | g* | r | g* | r* |
|   | b* | g | b | g | b* | g | b | g | b* | g | b | g | b* | g | b | g |
|   | g* | r* | g* | r | g* | r* | g* | r | g* | r* | g* | r | g* | r* | g* | r |
|   | b | g | b* | g | b | g | b* | g | b | g | b* | g | b | g | b* | g |
|   | g* | r | g* | r* | g* | r | g* | r* | g* | r | g* | r* | g* | r | g* | r* |
|   | b* | g | b | g | b* | g | b | g | b* | g | b | g | b* | g | b | g |
|   | g* | r* | g* | r | g* | r* | g* | r | g* | r* | g* | r | g* | r* | g* | r |
|   | b | g | b* | g | b | g | b* | g | b | g | b* | g | b | g | b* | g |
|   | g* | r | g* | r* | g* | r | g* | r* | g* | r | g* | r* | g* | r | g* | r* |
|   | b* | g | b | g | b* | g | b | g | b* | g | b | g | b* | g | b | g |
|   | g* | r* | g* | r | g* | r* | g* | r | g* | r* | g* | r | g* | r* | g* | r |
|   | b | g | b* | g | b | g | b* | g | b | g | b* | g | b | g | b* | g |

METHOD AND APPARATUS TO EXTEND THE EFFECTIVE DYNAMIC RANGE OF AN IMAGE SENSING DEVICE

CROSS REFERENCE TO RELATED APPLICATIONS

This is a divisional of U.S. application Ser. No. 10/946,919 filed Sep. 22, 2004, which is a continuation-in-part of U.S. application Ser. No. 09/615,398 filed Jul. 13, 2000, now U.S. Pat. No. 6,909,461 issued Jun. 21, 2005. The disclosure of the priority applications, in their entirety, including the drawings, claims, and the specification thereof, are incorporated herein by reference.

FIELD OF THE INVENTION

The invention relates generally to the field of image capture, and more specifically to a method of extending the effective dynamic range of an image sensing device.

BACKGROUND OF THE INVENTION

Image sensing devices, such as a charge-coupled device (CCD), are commonly found in such products as digital cameras, scanners, and video cameras. These image sensing devices have a very limited dynamic range when compared to traditional negative film products. A typical image sensing device has a dynamic range of about 5 stops. This means that the exposure for a typical scene must be determined with a fair amount of accuracy in order to avoid clipping the signal. In addition, oftentimes the scene has a very wide dynamic range as a result of multiple illuminants (e.g. frontlit and backlit portions of a scene). In the case of a wide dynamic range scene, choosing an appropriate exposure for the subject often necessitates clipping data in another part of the image. Thus, the inferior dynamic range of an image sensing device relative to silver halide media results in lower image quality for images obtained by an image sensing device.

An increase in the dynamic range of an image sensing device would allow images from digital cameras to be rebalanced to achieve a more pleasing rendition of the image. Also, increasing the dynamic range of an image sensing device would allow for more pleasing contrast improvements to the image, such as is described by Lee et al. in commonly assigned U.S. Pat. No. 5,012,333.

U.S. Pat. No. 6,040,858 (Ikeda) provides a complete description of the problem of the limited dynamic range of image sensing devices. In addition, Ikeda describes methods of extending the dynamic range of an image sensing device by utilizing multiple image signals, each with different responses to exposure. These multiple signals are combined by using thresholds, which determine which signal is of higher quality at each position in the image signal to form an image signal having extended dynamic range. Ikeda improves upon these methods by describing a method by which these thresholds are determined for each color.

However, these prior art methods, including Ikeda, require multiple image signals to form an image signal having extended dynamic range. Attaining such multiple signals can cause difficulty. For example, if the multiple image signals are not captured simultaneously, objects moving in the scene or motion of the camera may produce artifacts in an image signal having extended dynamic range. Additionally, if the image signals are captured simultaneously but on separate image capture devices, then a correspondence problem exists. Moreover, the additional hardware adds undesirable cost to the imaging system.

U.S. Pat. No. 5,051,770 to Cornuejols discloses a device, in which a flat screen modifies, on a pixel by pixel basis, light received by a sensor.

U.S. Published Patent Application 2003/0052976 describes a photographic device having photosites of different sensitivities, controlled by drive voltages. Different exposure times can be imparted to the photosites.

Thus, there exists a need to improve upon the method of the prior art in order to improve the dynamic range of an image sensing device. Specifically, there exists a need to produce an extended dynamic range image signal with a single image sensing device and a single image signal.

SUMMARY OF THE INVENTION

The invention is defined by the claims. The present invention is directed to overcoming one or more of the problems set forth above. Briefly summarized, according to one aspect of the present invention, an image sensor generates an image signal with a differential response to image light. The image sensor has an array of photosites divided into standard photosites and non-standard photosites. A limiter provides the standard photosites with a predetermined standard response to a light exposure and the non-standard photosites with a predetermined slower response to the same light exposure. The standard photosites and nonstandard photosites both sparsely sample the array in a predetermined pattern.

In the present invention, selected photosites of the image capture device are designed to have non-standard response to exposure. These non-standard photosites generally have a slower response to exposure than do the non-selected, or standard, photosites. The advantage of the invention is that the image signal from such an image capture device is processed to take advantage of the dynamic ranges of all photosites. Thus, an image signal having increased dynamic range is produced by interpolating the values of neighboring photosites for those photosites that are saturated or at a noise level.

BRIEF DESCRIPTION OF THE DRAWINGS

The above-mentioned and other features and objects of this invention and the manner of attaining them will become more apparent and the invention itself will be better understood by reference to the following description of an embodiment of the invention taken in conjunction with the accompanying figures wherein:

FIG. 3A illustrates the arrangement of non-standard photosites and standard photosites on a panchromatic embodiment of the image sensor.

FIG. 3B illustrates the arrangement of non-standard photosites and standard photosites on an embodiment of a color image sensor.

FIG. 4 shows an exploded block diagram of the dynamic range extending filter array (DREFA) processor shown in FIG. 1.

Figures 9A, 9B, 9C:
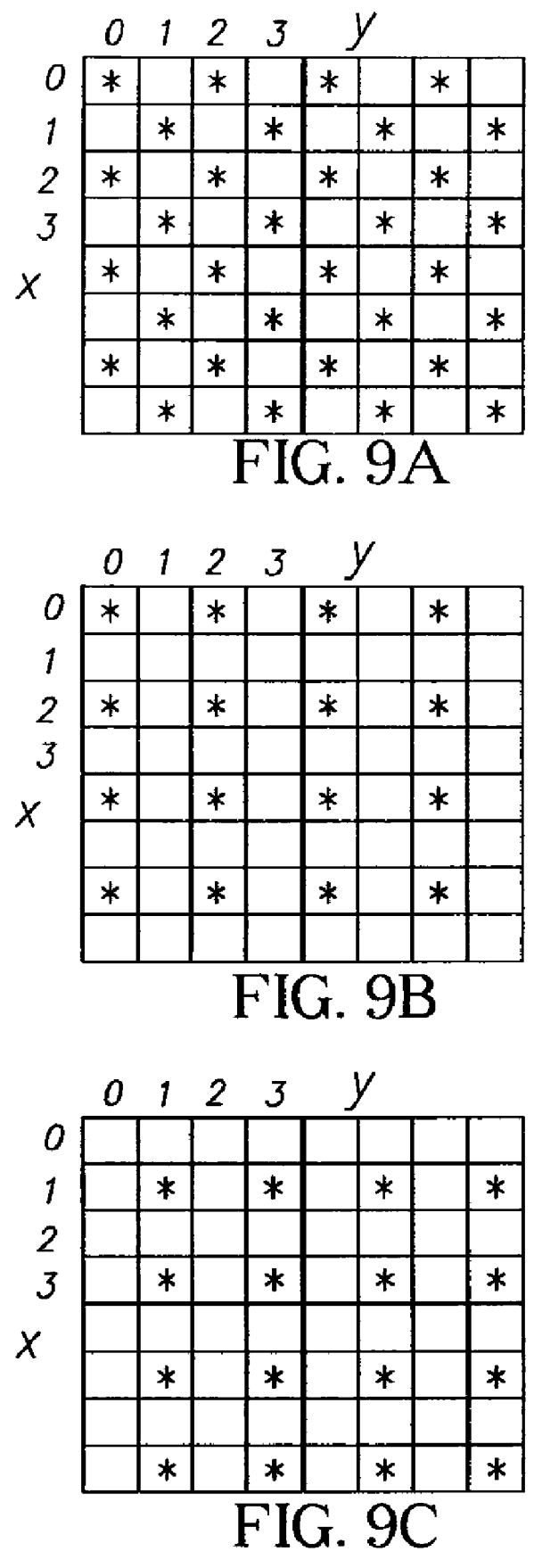

FIGS. 9A-9C illustrate the arrangement of non-standard photosites and standard photosites in three different embodiments of the image sensor FIG. 10 illustrates the arrangement of non-standard photosites and standard photosites on another embodiment of a color image sensor.

Figures 10, 11, 12:
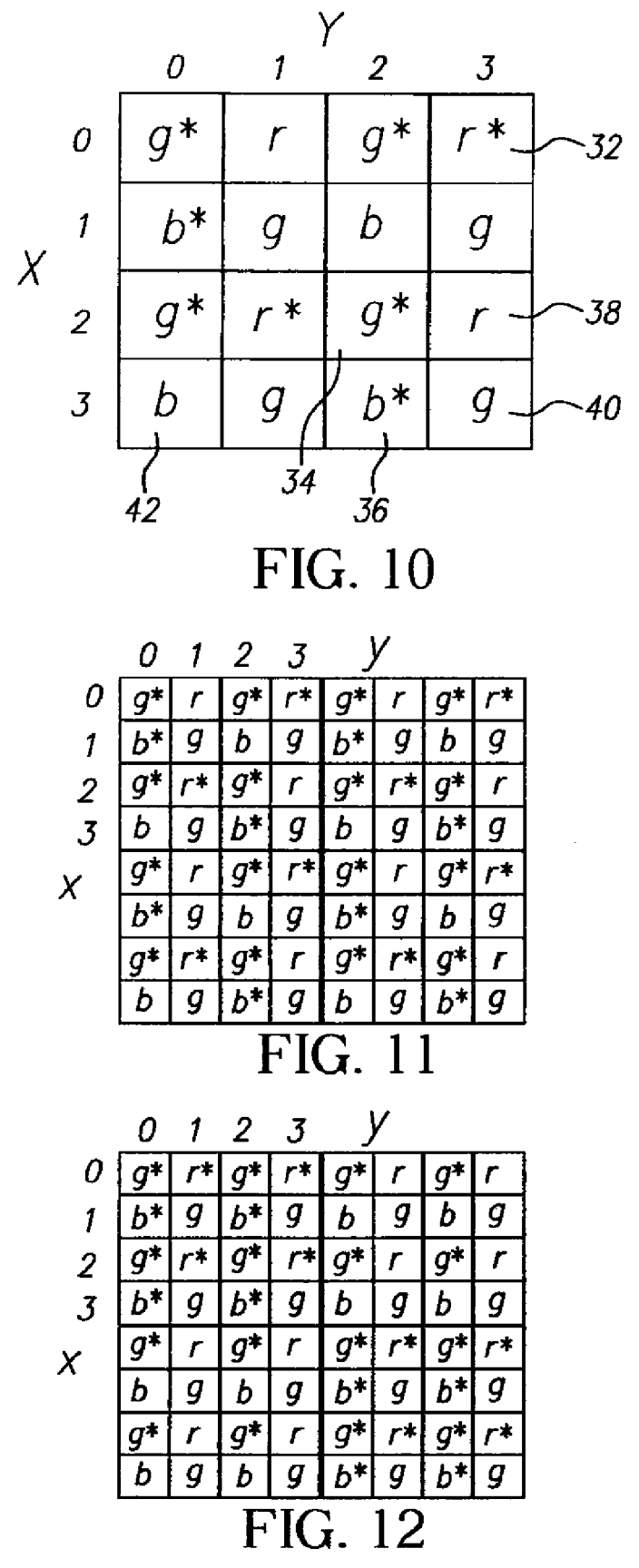

FIG. 11 illustrates the same embodiment as FIG. 10 and shows an 8×8 array having a 4×4 repeating unit.

FIG. 12 illustrates an 8×8 array of another embodiment of the color image sensor having an 8×8 repeating unit.

FIG. 13 illustrates the same embodiment as FIG. 10 and shows a 16×16 array having a 4×4 repeating unit.

Figure 14:
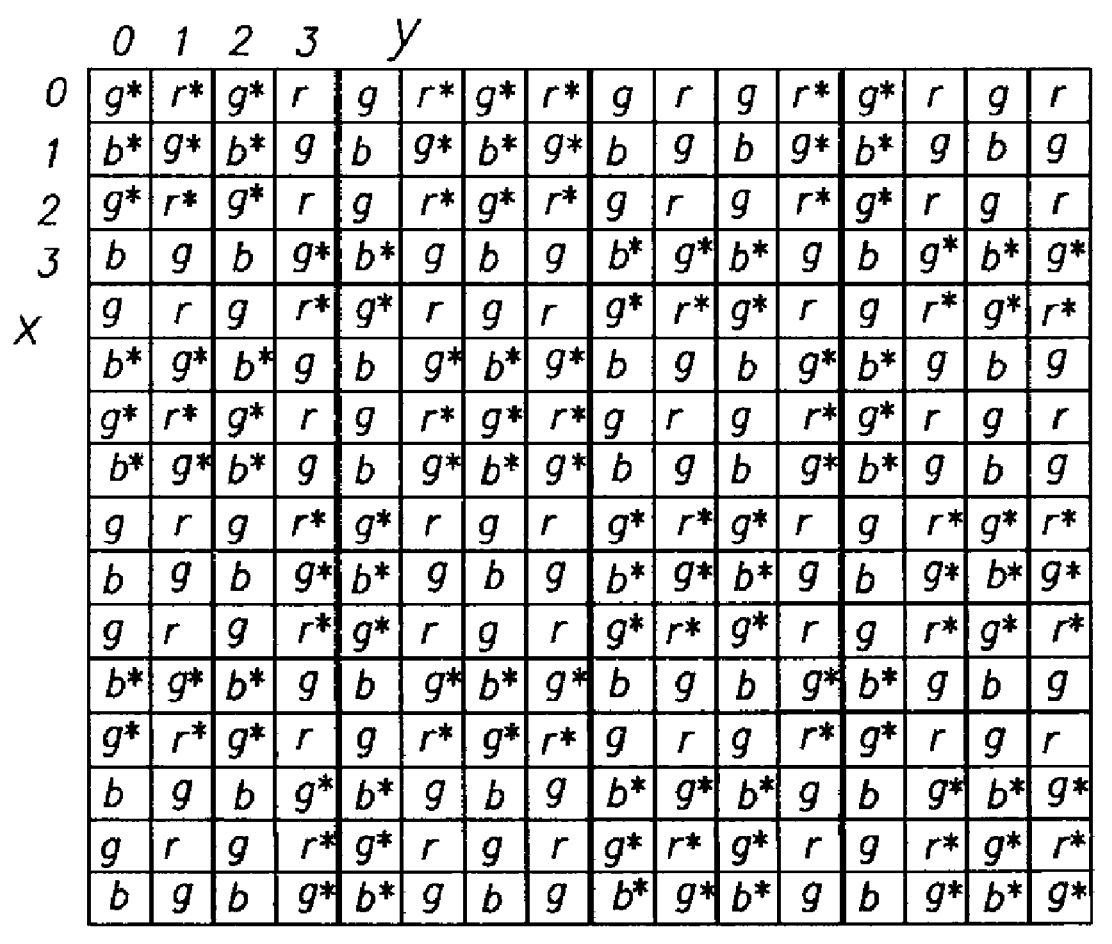

FIG. 14 illustrates another embodiment of the color image sensor having a 16×16 repeating unit.

DETAILED DESCRIPTION OF THE INVENTION

Because imaging devices employing electronic sensors are well known, the present description will be directed in particular to elements forming part of, or cooperating more directly with, apparatus in accordance with the present invention. Elements not specifically shown or described herein may be selected from those known in the art. Note that as used herein, the term image is a two dimensional array of values. An image may be a two dimensional subset of another image.

Figure 1:
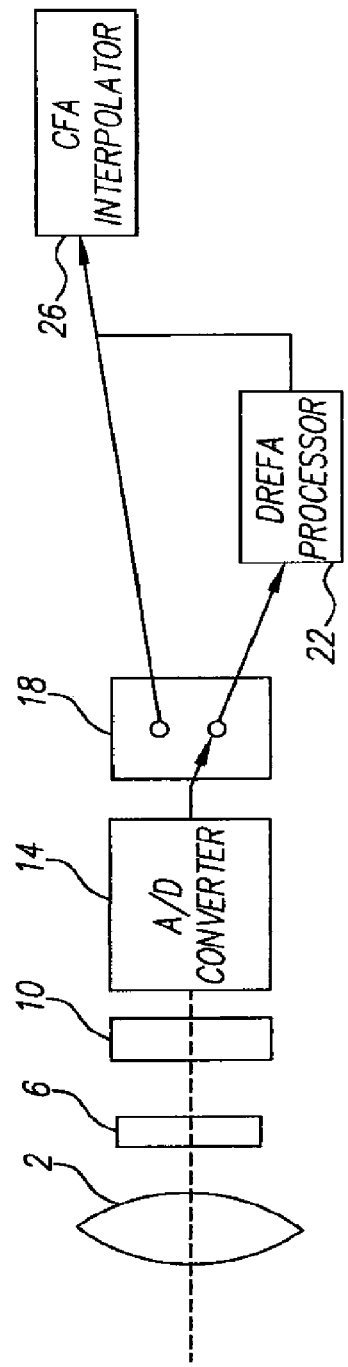
FIG. 1 is a block diagram of an extended-range image sensing device according to the invention.

Referring to FIG. 1, light from an object or scene is incident upon a lens 2. An optical low pass filter 6 performs a slight blurring of the image in order to reduce the occurrence of aliasing. The image falls on an image sensing device 10 such as a charged-coupled device (CCD). Note that other devices, such as CMOS devices, may be used as the image sensing device 10.

An A/D converter 14 converts the image signal from the image sensing device 10 into a digital signal. More specifically, the A/D converter 14 converts the linear voltage signal from the image sensing device 10 to a discrete digital signal, preferably a 10 bit signal. Thus, the linear encoded values range from 0 to 1023. The A/D converter 14 also preferably performs processing to convert the linear 10 bit signal to an 8 bit logarithmic signal, as is commonly performed in the art. The following equation is used to convert the 10 bit linear signal a(x,y), where (x,y) specifies the row and column index of the signal location with reference to the image sensing device 10, into the 8 bit logarithmic signal b(x,y):

$$b(x, y) = \begin{cases} 0 & 0 \leq a(x, y) \leq 31 \\ 73.5975 \ln a(x, y) - 255 & 32 \leq a(x, y) \leq 1024 \end{cases}$$

Note that each stop of exposure (in the linear response region of the image sensing device) results in a doubling of the linear signal a(x,y) and results in an increase of the logarithmically encoded signal b(x,y) by 51. In this case, the value 51 represents the number of code values per stop (cvs) of exposure.

The system controller 18 determines on the basis of user input or on the basis of the image signal output from the A/D converter 14 whether the dynamic range needs to be expanded (i.e. with the "expanding mode" of processing) or whether there is no need for expanding (i.e., the "normal mode" of processing). The system controller 18 then diverts the digital image signal b(x,y) to either the dynamic range extending filter array (DREFA) processor 22 if the system controller 18 is in an expanding mode, or to the color filter array (CFA) interpolator 26 if the system controller 18 is in a normal mode. Alternatively, the system controller 18 may be set at the time of manufacture to always be in the "expanding mode."

In the "normal mode", the system controller 18 diverts the image signal output from the A/D converter 14 to the CFA interpolator 26. The purpose of the CFA interpolator 26 is to generate a full description of the color for each location of the digital image. In the preferred embodiment, the image sensing device 10 consists of an array of photosensitive elements. Each photosite is typically coated with either a red, green, or blue filter, as described by Bayer in commonly assigned U.S. Pat. No. 3,971,065, which is incorporated herein by reference. The Bayer array is a color filter array in which green filters are located in a checkerboard pattern over the photosites with red and blue filter alternating line by line to fill the interstices of the checkerboard pattern; this produces twice as many green filter sites as either red or blue filter sites. Note that the method described herein may be easily extended to color filter arrays with different arrangements of the primaries, a different number of primaries, or a different set of primaries. Thus, in the preferred embodiment, each photosite is sensitive to either red, green, or blue light. However, it is desirable to obtain a value of exposure for each of the red, green, and blue exposures at each photosite location. In this description, "red", "green", and "blue" represent the primaries of an image sensing device 10, as is well known in the art of image processing. A CFA interpolator 26 generates from the image signal output from the A/D converter 14 an interpolated image signal consisting of a value for each of the primaries of a photosensitive element. For example, if a particular photosite is coated with a red filter, then the A/D converter 14 outputs a red level of exposure for that photosite since the red filter essentially blocks green and blue light from reaching the image sensing device 10.

The operation of the CFA interpolator 26 is to determine the levels of exposure for a red photosite for both the green and the blue primaries. Similarly, the CFA interpolator 26 determines the green and red exposure levels for the blue photosites, as well as the red and the blue exposure levels for the green photosites. Generally, the CFA interpolator 26 operates by considering the exposure values of the photosite and the values of surrounding photosites. While any commonly known interpolator may be used, a description of a preferred CFA interpolator is contained in commonly assigned U.S. Pat. No. 5,652,621, entitled "Adaptive color plane interpolation in single sensor color electronic camera", which is incorporated herein by reference. This patent describes apparatus for processing a digitized image signal obtained from an image sensor having color photosites aligned in rows and columns that generate at least three separate color values but only one color value for each photosite location, and a structure for interpolating color values for each photosite location so that it has three different color values. The apparatus generates an appropriate color value missing from a photosite location by the interpolation of an additional color value for such photosite locations from color values of different colors than the missing color value at nearby photosite locations. The apparatus also obtains Laplacian second-order values, gradient values and color difference bias values in at least two image directions from nearby photosites of the same column and row and selects a preferred orientation for the interpolation of the missing color value based upon a classifier developed from these values. Finally, the missing color value from nearby multiple color values is selected to agree with the preferred orientation.

In the "expanding mode", the system controller 18 diverts the image signal output from the A/D converter 14 to the DREFA processor 22 in order to expand the dynamic range of the image signal. In the preferred embodiment, the dynamic range of the image sensing device 10 is expanded by selecting certain photosites of the image sensing device 10 to have a non-standard response. The arrangement of the selected photosites with respect to the image sensing device 10 will be discussed in greater detail hereinbelow. In the preferred embodiment, the responses of selected photosites are slowed by altering the gain of the selected photosites, herein referred to as non-standard photosites. Altering the gain of a photosite is commonly practiced in the art of digital camera design and manufacture.

Figure 5:
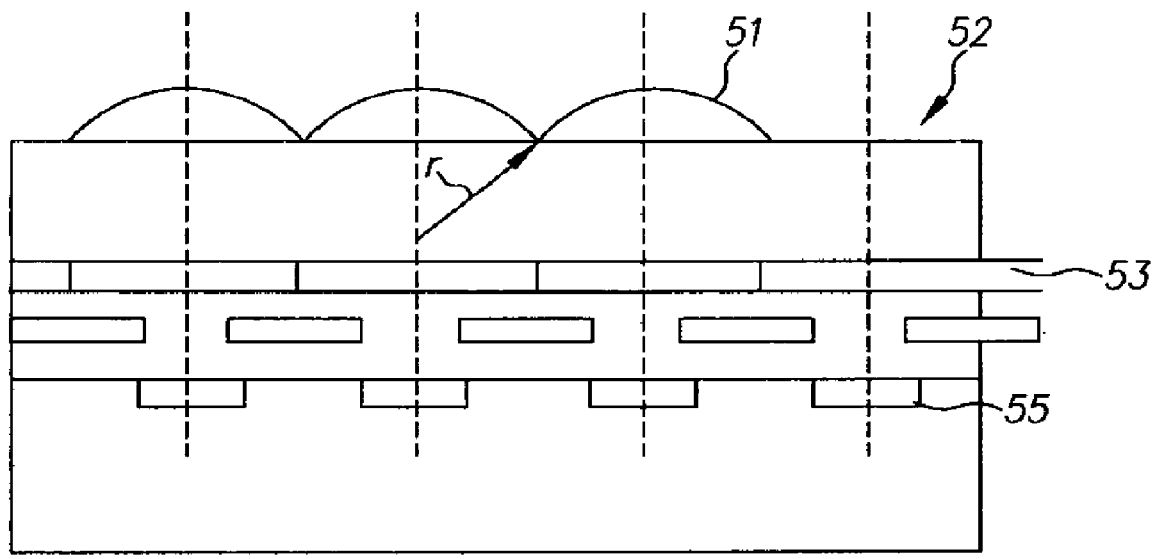
FIG. 5 is a cross-section of an interline image sensor employing an array of lenslets to alter the response of selected photosites.

With reference to FIG. 5, it is a common practice in the art of image sensor manufacture to place resin lenslets 51 on top of each photosite. For example, particularly when the image sensing device 10 is an interline solid state image sensing device, one lenslet technique is described in U.S. Pat. No. 4,667,092, entitled "Solid-state image device with resin lens and resin contact layer", which is incorporated herein by reference. In this patent, more specifically, a solid-state image device includes an image storage block having a block surface and a plurality of storage elements are embedded along the block surface to store an image in the form of electric charge. An overlying layer is deposited to form an array of optical lenses in correspondence to the storage elements. An intermediate layer is laid between the block surface and the overlying layer. Incident light focuses through the lenses and the intermediate layer onto the storage elements. The intermediate layer serves as an adjusting layer for adjusting a focal length.

FIG. 5 shows a cross section of an interline solid state image sensing device. Without the lenslets 51, the signal readout area associated with each photosensitive area 55 of a photosite makes it impossible to use the whole area of the semiconductor substrate as the photoelectric transducer area. The conventional solid-state image device does not effectively utilize all incident rays thereon and therefore has low sensitivity. The addition of a resin lenslet 51 on top of a photosite allows the incident rays of light to be focused on the photoactive areas of the photosite, thereby more effectively utilizing the incident rays of light and increasing the sensitivity of the photosite. Thus, by varying the size and/or efficiency of the lenslet 51, the sensitivity (gain) of the photosite may be easily altered. Thus, for interline devices and for CMOS sensors, the preferred method of altering the gain of the photosite is by altering the lenslet 51 placed on top of the photosite. As shown in FIG. 5, the location 52 has no lenslet, and therefore fewer incident rays of light are incident with the photosensitive area. Alternatively, a lenslet could be manufactured at location 52 with a different radius, shape, size or material as compared with the lenslet 51, thereby structured to be less efficient at focusing incident rays of light onto the photosensitive area 55 than is the standard lenslet 51. Those skilled in the art will recognize that if the lenslet 51 focuses 80% of the incident rays of light onto a photosensitive area 55 and the region 52 having no lenslets (or alternatively non-standard lenslets) allows 20% of the incident rays of light onto a photosensitive area 55, then the photosite covered by lenslet 51 is 2 stops faster than the region 52. In this case, the lenslet 51 is used for standard photosites and no lenslet is used for non-standard photosites, as represented by region 52.

Figure 6:
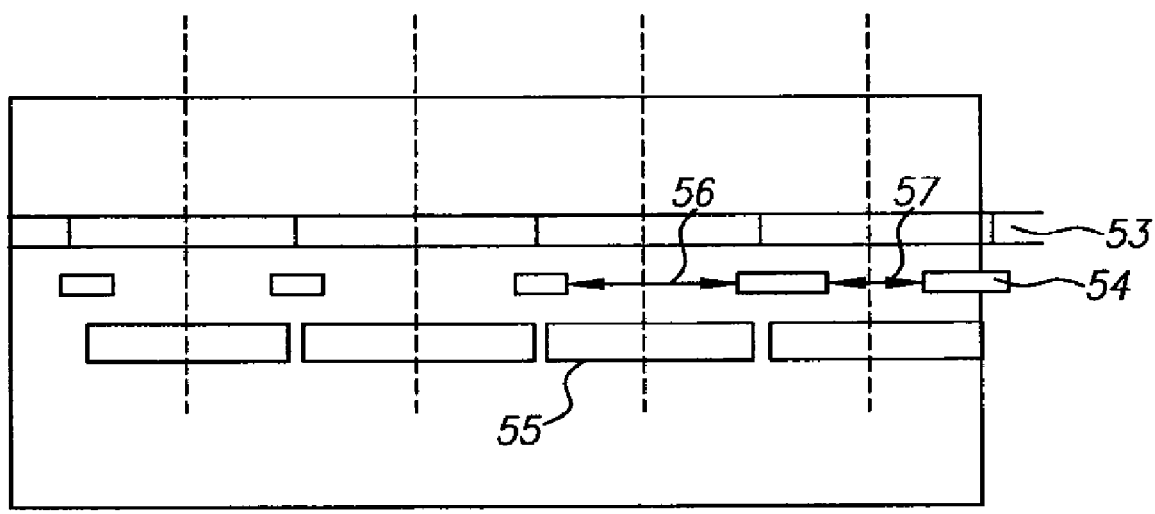
FIG. 6 is a cross-section of a full frame image sensor employing a metal mask to alter the response of selected photosites.

With reference to FIG. 6 showing a cross section of a full frame image sensing device 10, in the case where the image sensing device 10 is a full frame device, light rays incident to the photosensitive area 55 of a photosite must pass through an aperture of a mask, typically made from metal, which is shown in cross-section in FIG. 6 to comprise light-blocking metallic mask portions 54 and open apertures 56 and 57 interspersed among the metallic portions. In the preferred embodiment, the gain of photosites may be altered by modifying the metal mask 54 light shield. The sensitivity of the photosite is then directly related to the aperture of the metal mask 54 light shield. For example, one photosite with an aperture 50% of the size of a second photosites aperture will have a response of 50% compared to that on the second photosite. For example, a first aperture 56 of a light shield 54 allows 80% of the light rays incident upon that photosite to pass through, but a second aperture 57 is smaller and allows only 20% of the incident light rays to pass. Those skilled in the art will recognize that the photosite with the larger first aperture 56 is 2 stops faster than a photosite with the smaller second aperture 57. In this case, the first aperture 56 is used for standard photosites, and the second aperture 57 is used for the non-standard photosites. Thus, the aperture of a light mask may be modified to adjust the response of the selected photosites. Kodak makes full frame image sensing devices with a metal mask light shield that reduces the pixel active area of all pixels from about 80% to about 20% (for dithered scanner applications where the sensor is moved by ½ the pixel spacing horizontally and vertical and 4 pictures are taken). The invention thus involves utilizing such mask technology, but with different sized apertures, to provide an image sensor with a differential response to image light.

Electronic control of the individual photosites can also provide the standard photosites and non-standard photosites. For example, U.S. Patent application 20030052976 describes a photographic device having photosites of different sensitivities, controlled by drive voltages. Different exposure times can be imparted to the photosites via the drive voltages. For example, the photosites having the shortest exposure times are non-standard photosites and photosites having longer exposure times are standard photosites.

Figure 15:
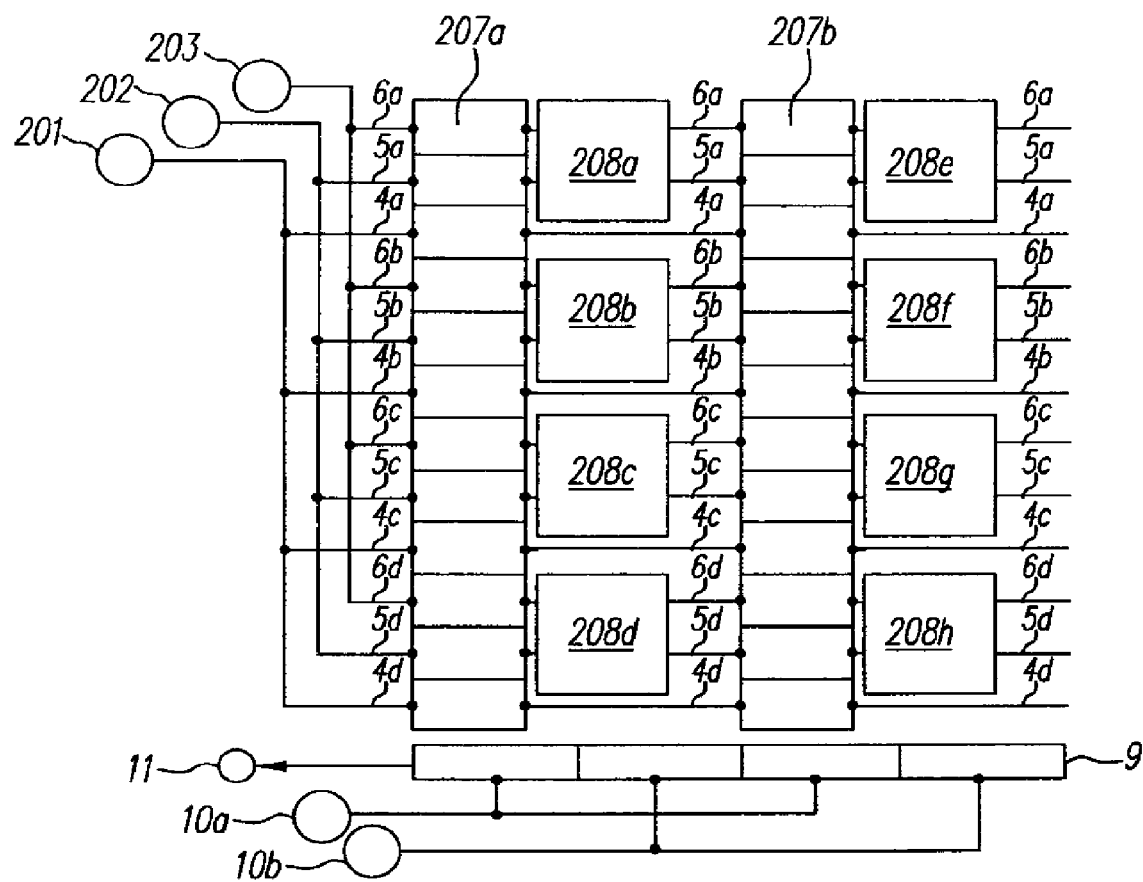
FIG. 15 illustrates the layout of components of a prior art device that can be used in another embodiment of the color image sensor.

FIG. 15 shows an example of an image sensor having photosites with different sensitivities (i.e. standard photosites and non-standard photosites) by using drive voltages to control the sensitivities of the photosites, as described in U.S. Published Patent Application 2003/0052976. FIG. 15 illustrates a plurality of photosites 208a to 208h, a plurality of vertical transfer registers 207a and 207b a first drive-voltage applying electrode 203, and a second drive-voltage applying electrodes 201 and 202. The photosites (also called PDs or photodiodes) 208a to 208h are arranged in a horizontal direction and a vertical direction. The vertical transfer registers 207a and 207b transfer the electric charges accumulated in the photosites in the vertical direction. The first drive-voltage applying electrode 203 is arranged parallel to the vertical transfer registers, for applying a drive voltage to a specific one of the vertical transfer registers. The second drive-voltage applying electrode 201 to 202 is arranged perpendicular to the vertical transfer registers, for applying a second drive voltage to the vertical transfer registers at the same time. The electric charges accumulated in the photosites are transferred to the vertical transfer registers, due to the voltage output from the first drive-voltage applying electrode or the second drive-voltage applying electrode, or the voltages output from both electrodes. Therefore, the photosites can have different sensitivities. The photosites with the standard response to a light exposure are called standard photosites and the photosites with a slower response to the same light exposure are called non-standard photosites.

Figure 2:
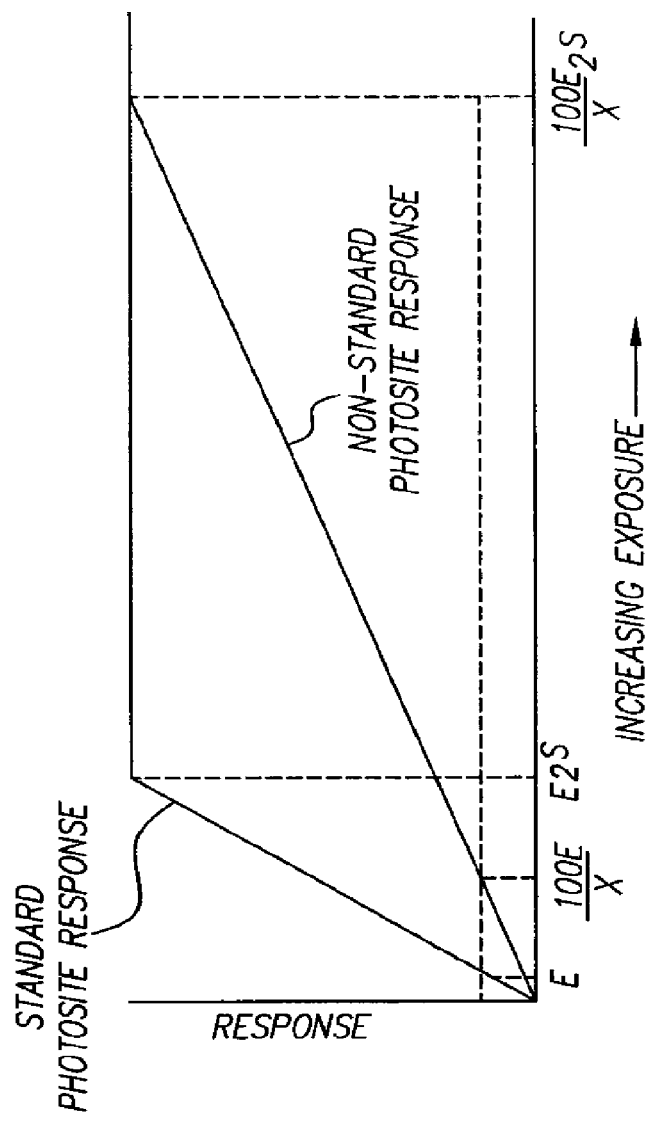
FIG. 2 is a graph illustrating the response of a standard photosite and a non-standard photosite.

In the preferred embodiment, the response of the selected non-standard photosites is X % (where X<=100) that of standard photosites for the same exposure, as shown graphically in FIG. 2. The selected photosites have a response that is slowed by two stops (–log X/100) relative to the standard photosites. In the preferred embodiment, X=25. The value of parameter X (i.e. the amount of difference between the response of the standard photosites and the non-standard photosites) effectively limits the dynamic range of the image sensor. The value of parameter X can be a constant set at the time of manufacture, or selected by the user prior to image capture or selected by an algorithm residing in the system controller 18 that analyzes image data from a prior image of the scene to determine the dynamic range of the scene, then sets the value of parameter X appropriately. In the preferred embodiment, when the system controller 18 is in "normal mode", all photosites have common gain equivalent to that of the standard response. Thus, the image sensing device 10 consists of multiple sets of photosites, the standard photosites and the non-standard photosites. The collection of the outputs of the standard photosites constitutes a sparsely sampled version of a scene. Likewise, the collection of the outputs of the non-standard photosites constitutes another sparsely sampled version of a scene.

Figure 7:
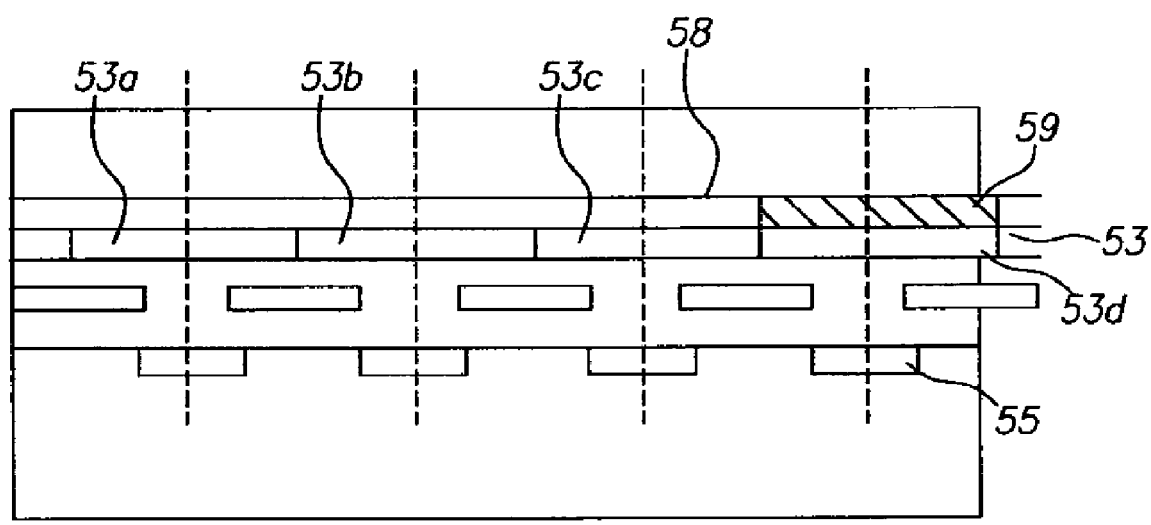
FIG. 7 is a cross-section of an image sensor employing an array of neutral density filters to alter the response of selected photosites.

As another alternative, the responses of the selected non-standard photosites can be slowed by the use of a neutral filter coating the photosite. FIG. 7 shows a cross section of an image sensing device with a color filter array 53. Note that the color filter array 53a is red, 53b is green, 53c is red, and 53d is green. A layer of neutral filters 58 is contained above the color filter array 53, although the position of the layer of neutral filters 58 and the color filter array 53 does not matter. Note that the layer of neutral filters 58 only contains a neutral filter at the positions of selected photosites, as indicated by the neutral filter 59. In this case, the layer of neutral filters 58 is transparent or nearly transparent for standard photosites and contains a neutral filter 59 for non-standard photosites. For example, if the neutral filter 59 consists of a material that allows X % transmission of light, then the response of that non-standard photosite will be slowed by $$-\log_2\left(\frac{X}{100}\right)$$

stops relative to the response of the standard photosite. If a neutral filter 59 is used to create non-standard photosites, then the system controller 18 is preferably set at the time of manufacture to be in "expanding mode."

Implementation of the standard photosites and non-standard photosites is accomplished by a limiter. The limiter is a physical or logical device that modifies sensitivity of a set of non-standard photosites on an image sensor such that the standard photosites have a first predetermined response to a light exposure and the non-standard photosites have a second, slower predetermined response to the same light exposure. The limiter can be implemented with a structural element overlaying the photosites such as the differing size lenslets over standard and non-standard photosites, differing size apertures in the mask for standard and non-standard photosites, and differing neutral filters over standard and non-standard photosites. The limiter can also be a programmed feature of the image sensor and supporting electronics, such as a logical device that uses different drive voltages to control exposure time and/or gain of the standard and non-standard photosites.

The purpose of the DREFA processor 22 is to create a digital image signal with an increased dynamic range by processing the digital image signal while considering the standard and non-standard photosites. The operation of the DREFA processor 22 will be described in detail hereinbelow. Accordingly, the output of the DREFA processor 22 is an expanded image signal having increased dynamic range. This expanded image signal is then input to the CFA interpolator for processing as previously described.

Figure 8:
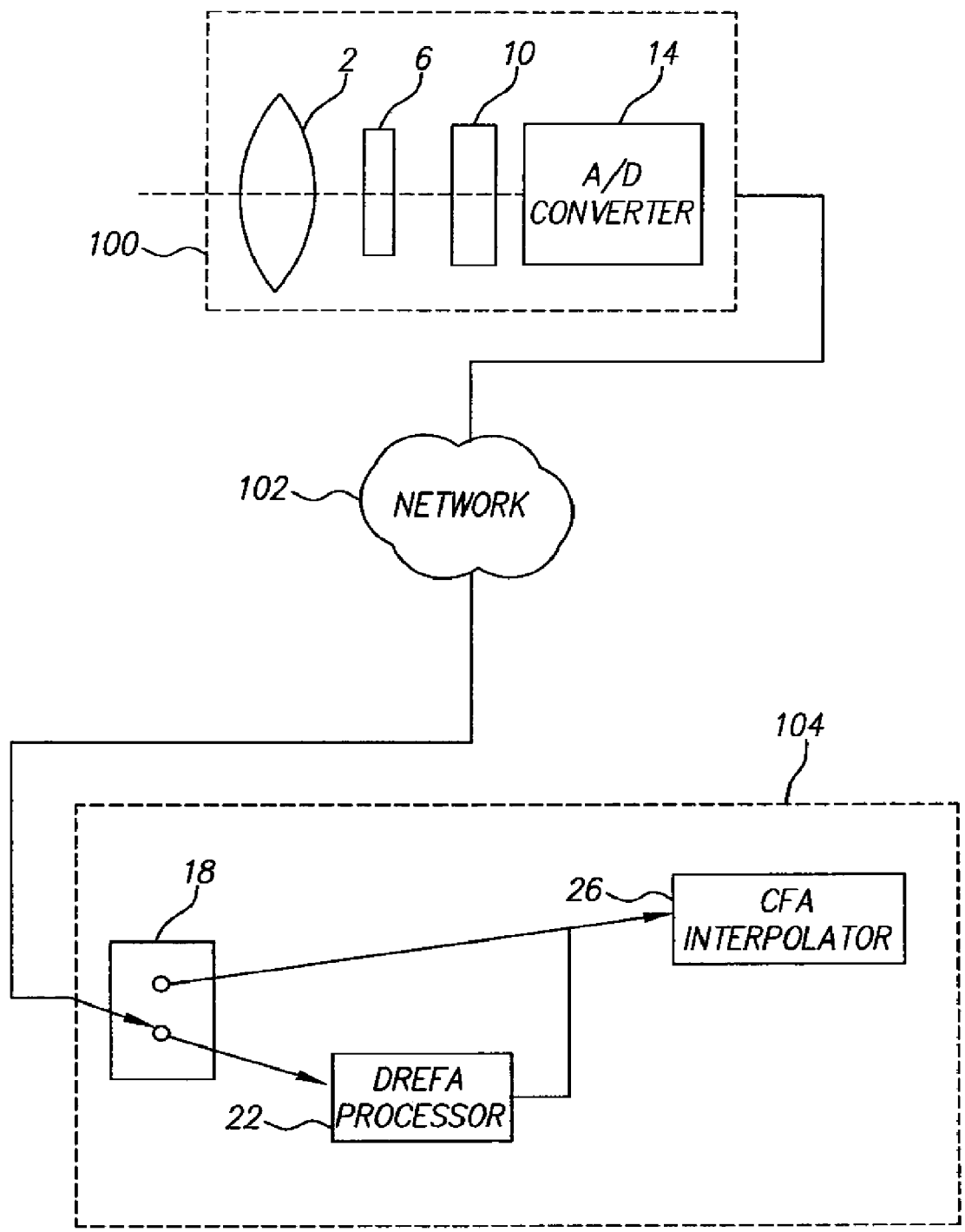
FIG. 8 is a block diagram of an embodiment of the image capture system.

Note that although FIG. 1 implies that the A/D converter 14 and the DREFA processor 22 are directly connected, this is not a requirement for the present invention. The DREFA processor 22 may reside in hardware or software in close proximity to the A/D converter 14 and image sensing device 10. For example, the DREFA processor 22 could reside directly within a digital camera. However, the DREFA processor 22 may also be remote from the image sensing device 10. For example, referring to FIG. 8, the image signal output from the A/D converter 14 can be transmitted (after compression) from the digital camera 100 to a host computer 104. Transmission can, optionally, be through a network 102. Likewise, the image signal output from the A/D converter 14 can be transmitted (after compression) via a wire or wireless connection to a personal computing device, printer, or remote server (not shown) to apply to operation of the DREFA processor 22. Transmission of the image signal may also include file transfer protocol or email. Additionally, payment via credit card or some other means may be required by the DREFA processor 22 from the user.

The ratio of standard photosites to non-standard photosites ranges between 1:16 and 16:1 (numeric ranges herein are inclusive). The ends of this range are very sparsely sampled with one of the types of photosites resulting in low resolution for that type of photosite. A range with better resolution is between 1:4 and 4:1. In the preferred embodiment, 50% of the photosites of the image sensing device 10 are selected to have non-standard response. Those skilled in the art will recognize that varying the percentage of photosites that have non-standard response will still result in the advantages of the present invention. In the case of a image sensing device 10 in which all photosites have approximately equivalent spectral sensitivity (i.e. a pan-chromatic image sensing device), FIG. 3A shows an arrangement of the non-standard photosites that will result in approximately 50% of all the photosites of the image sensing device 10 being of non-standard response. The photosites 28 with non-standard response are marked with an asterisk (*), while the photosites 30 having standard response are blank.

In the case of a color image sensing device 10, FIG. 3B shows an arrangement wherein 50% of each type (red, green, or blue sensitive) of photosite has non-standard response. For example, the photosite 32 is a red photosite having non-standard response, the photosite 34 is a green photosite having non-standard response, the photosite 36 is a blue photosite having non-standard response, the photosite 38 is a red photosite having standard response, the photosite 40 is a green photosite having standard response, the photosite 42 is a blue photosite having standard response.

The 4×4 pattern shown in FIG. 3B can be repetitively tiled to fill an image sensor. In other words, the image sensor is made up of a repeating pattern having a repeating unit of four by four pixels. It has been analytically determined that there are 648 patterns of 4 by 4 pixels with the Bayer color filter array wherein 50% of each type (red, green, or blue sensitive)

of photosite has non-standard response (of which FIG. 3B is one example). The repeating unit can be larger than four by four pixels as shown by FIGS. 12 and 14. In FIG. 12, an eight by eight pixel repeating unit is shown. In FIG. 14, a sixteen by sixteen pixel repeating unit is shown.

Note that FIGS. 3A and 3B imply a regular pattern for the location of the non-standard photosites. While it is preferable that the non-standard photosites are arranged in a regular pattern, it is by no means necessary. The non-standard photosites could be arranged randomly or semi-randomly over the surface of the image sensing device 10, and their location would be stored in some place accessible to the DREFA processor 22.

The response of a standard photosite to a certain exposure and the response of a non-standard photosite to the same exposure are shown in FIG. 2. Note that if a level of noise n is superimposed on the response, it can easily be seen that the standard photosite will yield a valid signal with lower exposures (beginning at exposure level E) than will the non-standard photosite (which yields valid signal beginning at $$\frac{100}{X}E.)$$

Alternatively, data from the non-standard photosite will be valid for higher exposure levels (up to signal level of $$\frac{100}{X}E2^s,$$

where S is the inherent dynamic range of a single photosite, typically S=5 stops) than would the standard photosite (which produces valid response up to an exposure of $E2^S$.) Note that both the standard photosite and the non-standard photosite have the same range of response in stops of exposure (S), but the response of the non-standard photosites is preferably $$-\log_2\left(\frac{X}{100}\right)$$

stops slower than the standard photosites, as shown in FIG. 2. It is preferred that the responses of the standard and non-standard photosites overlap with respect to exposure. That is, it is preferred that $$-\log_2\left(\frac{X}{100}\right) < S.$$

The overall dynamic range of the image sensing device, considering both standard and non-standard photosites, is $$S - \log_2\left(\frac{X}{100}\right).$$

In the case of the preferred embodiment, where S=5 and X=25, the overall effective dynamic range of the image sensing device 10 is 7 stops of exposure.

The processing of the DREFA processor 22 may be utilized to extend the overall dynamic range of the image sensing device 10 by using the non-standard photosite response to reconstruct the areas in the image where very high exposures occur. Likewise, the DREFA processor 22 also uses the photosites with standard response to reconstruct the signal where very low exposures occur.

FIG. 4 shows an exploded block diagram of the DREFA processor 22. The logarithmic image signal b(x,y) output from the A/D converter 14 is passed to the non-standard compensator 44. The purpose of the non-standard compensator 44 is to compensate the non-standard photosites by accounting for the offset in response by X stops. In the preferred embodiment, the image signal corresponding to the non-standard photosites are incremented by the quantity $$-cvs \log(X/100),$$

where cvs is the number of code values per stop of exposure. In the preferred embodiment, the quantity cvs is 51.

Alternatively, if the image signal input to the non-standard compensator 44 is linearly related to exposure (rather than logarithmically), then the non-standard compensator 44 scales the image signal corresponding to the non-standard photosites by a factor of 100/X. Note that it is assumed that the locations of the non-standard photosites are known to the non-standard compensator 44. The output of the non-standard compensator 44 is an image signal i(x,y) that has been compensated at the locations of non-standard photosites for the difference between the non-standard photosite response in relation to the standard photosite response. At the locations of standard photosites, the value of the image signal b(x,y) output from the A/D converter 14 is identical to the value of the image signal i(x,y) output from the non-standard compensator 44. Note that the image signal i(x,y) is not limited to an 8 bit range. It the preferred embodiment, the value of i(x,y) ranges from 0 to 357.

Next, the image signal i(x,y) output from the non-standard compensator 44 is input to a non-standard thresholder 46. The purpose of the non-standard thresholder 46 is to determine problem locations of the non-standard image signal that are of low quality due to a photosite not receiving enough photons to produce a valid signal or due to a photosite receiving so many photons that the signal saturates. The image signal at these (x,y) locations is then replaced by calculating a new signal based upon nearby samples of the standard image signal in processing performed by the signal extender 50, which will be described in detail hereinbelow. All (x,y) locations of the non-standard signal for which the corresponding values of the non-standard signal are less than a predetermined threshold are considered to be problem locations. In the case of the non-standard photosite, this predetermined threshold used for the purpose of detecting problem locations is referred to as the low exposure response threshold. Thus, a location (x,y) is considered to be a problem location if it is a non-standard photosite and if:

$$i(x,y) < T_1$$

where $T_1$ is predetermined. In the preferred embodiment, the value of $T_1$ is $$-cvs\log_2\left(\frac{X}{100}\right),$$

which in the preferred embodiment is 102. Note that the threshold $T_1$ may be dependent upon the color of the photosite at location (x,y). Non-standard photosites that are problem locations are referred to as noise pixels, since the value of i(x,y) is not sufficiently about the noise level of the image sensing device to be useful.

Likewise, the image signal i(x,y) output from the non-standard compensator 44 is input to a standard thresholder 48. The purpose of a standard thresholder 48 is to determine problem locations of the standard image signal that are of low quality. The image signal at these locations is then replaced by calculating a new signal based upon nearby samples of the non-standard image signal in processing performed by the signal extender 50, which will be described in detail hereinbelow. All (x,y) locations of the standard image signal for which the corresponding values of the standard signal are less than a predetermined threshold signal are considered to be problem locations. In the case of the standard photosite, this predetermined threshold used for the purpose of detecting problem locations is referred to as the high exposure response threshold. Thus, a location (x,y) is considered to be a problem location if it is a standard photosite and if:

$$i(x,y) > T_2$$

where $T_2$ is predetermined. In the preferred embodiment, the value of $T_2$ is 254. Note that the threshold $T_2$ may be dependent upon the color of the photosite at location (x,y). Standard photosites that are problem locations are referred to as saturated pixels, since the value of i(x,y) is as high as possible at these locations.

The problem locations determined by the non-standard thresholder 46 and the problem locations determined by the standard thresholder 48 are input to the signal extender 50. In addition, the image signal i(x,y) output from the non-standard compensator 44 is also input to the signal extender 50. The purpose of the signal extender 50 is to replace the image signal i(x,y) values at problem locations (x,y) with estimates of the signal herein referred to as replacement values, had the inherent dynamic range of each photosite of the image sensing device 10 been greater. If the problem location is coincident with a non-standard photosite, then the replacement value is calculated from neighboring image signal values coincident with standard photosites. In this embodiment, the term "neighboring" refers to a certain spatial distance. In the preferred embodiment, the photosites neighboring a selected photosites are those photosites within a distance of 2 photosites of the selected photosite. Likewise, if the problem location is coincident with a standard photosite, then the replacement value is calculated from neighboring image signal values coincident with non-standard photosites. In the preferred embodiment, the color of the photosite at the problem photosite is also taken into account. The replacement value for any problem location is preferably determined only by the signal originating from neighboring photosites of the same color. The output of the signal extender 50 is an image signal i'(x,y) having a dynamic range as if captured by an image sensing device 10 having photosites with inherent dynamic range of $$S - \log_2\left(\frac{X}{100}\right)$$

rather than the actual inherent dynamic range of S for each photosite of the image sensing device 10. Note that for all (x,y) locations that are not problem locations, the value of i'(x,y) is equivalent to i(x,y).

As an example of the processing performed by the signal extender 50 for the Bayer CFA pattern shown in FIG. 3B, if location (x,y) is a problem location and (x,y) is the location of a green photosite (such as photosite 34 in FIG. 3B), then the replacement value i'(x,y) for the image signal i(x,y) is calculated in the following manner:

$$i'(x,y) = 0.25 * [i(x-1,y-1) + i(x+1,y-1) + i(x-1,y+1) + i(x+1,y+1)]$$

Note that signal values that the calculation of i'(x,y) is dependent upon are expected to comply with certain requirements. For example, suppose that (x,y) is a problem location and (x,y) is a green photosite with non-standard response. Then the signal levels of neighboring photosites are used to calculate replacement value i'(x,y). However, this assumes that the signal values of each of the neighboring photosites are also less than $T_3$. In the preferred embodiment, $T_3 = T_1$. For each neighboring photosite that this is not the case, that signal level is omitted from the calculation of the replacement value i'(x,y). For example, if i(x-1, y-1) > $T_3$, then the value i'(x,y) is calculated with the following formula:

$$i'(x,y) = \frac{1}{3} * [i(x+1,y-1) + i(x-1,y+1) + i(x+1,y+1)]$$

Generally, the interpolation scheme for determining a replacement value at problem location (x,y), where the location (x,y) corresponds to a green photosite which is also a standard photosite on a image sensing device having a Bayer pattern filter array is given with the following equation:

$$i'(x, y) = \frac{\sum_{j=-1,1} \sum_{k=-1,1} i(x+j, y+k) W(x+j, y+k)}{\sum_{j=-1,1} \sum_{k=-1,1} W(x+j, y+k)}$$

where $$W(x+j, y+k) = \begin{cases} 1 & i(x+j, y+k) > T_3 \\ 0 & \text{otherwise} \end{cases}$$

Note that the same equation is applied to determine the replacement value if the problem location corresponds with a green photosite which is also a non-standard photosite. However, in this case $$W(x+j, y+k) = \begin{cases} 1 & i(x+j, y+k) < T_4 \\ 0 & \text{otherwise,} \end{cases}$$

where in the preferred embodiment, $T_4 = T_2$.

As another example, also in connection with the Bayer CFA pattern shown in FIG. 3B, if location i(x,y) is a problem photosite and (x,y) is the location of a red or blue photosite, then the replacement value i'(x,y) for the image signal i(x,y) is calculated in the following manner:

$$i'(x,y) = 0.25 * [i(x-2,y) + i(x+2,y) + i(x,y+2) + i(x,y-2)]$$

When location (x,y) is a red or blue photosite and is also a standard photosite, the equation for determining the replacement value i'(x,y) may be generalized as follows:

$$i'(x, y) = \frac{\sum_{j=-2,0,2}\sum_{k=-2,0,2} i(x+j, y+k)W(x+j, y+k)}{\sum_{j=-2,0,2}\sum_{k=-2,0,2} W(x+j, y+k)}$$

where $$W(x+j, y+k) = \begin{cases} 1 & i(x+j, y+k) > T_3 \\ 0 & \text{otherwise} \end{cases}$$

Note that in this case, either j or k must be 0, but j and k are never both zero. Note also that the same equation is applied to determine the replacement value if the problem location corresponds with a red or blue photosite which is also a non-standard photosite. However, in this case $$W(x+j, y+k) = \begin{cases} 1 & i(x+j, y+k) < T_4 \\ 0 & \text{otherwise,} \end{cases}$$

where in the preferred embodiment, $T_4=T_2$.

The interpolation scheme described above for the purpose of generating an image signal with an extended dynamic range from more than one sparsely sampled image signals may be modified by those skilled in the art. However, many such modifications to the above interpolation scheme may be derived and should not be considered as significant deviations of the present invention.

Those skilled in the art will recognize that the above interpolation scheme performed by the signal extender is a lowpass filter, which is well known in the art. Typically, the application of a lowpass filter to a digital image signal has a similar effect to reducing the resolution of the digital image signal. Thus, the processing performed by the DREFA processor 22 is a method by which the spatial resolution of the image sensing device 10 may be traded for dynamic range of the image sensing device 10. Indeed, those areas of an image where the interpolation scheme is implemented to increase the dynamic range of the signal appear noticeably softer (less sharp) than the image would have if that same area of the image had been captured by the sensor in such a fashion that no "problem locations" (as defined by the non-standard thresholder 46 and the standard thresholder 48) occur.

The invention has been described in detail with particular reference to certain preferred embodiments thereof, but it will be understood that variations and modifications can be effected within the spirit and scope of the invention. For example, the invention provides an image capture system that expands the dynamic range in both directions, i.e., that expands the response of the standard photosites to increased exposures by utilizing the image signals from neighboring non-standard photosites and expands the response of the non-standard photosites to decreased exposures by utilizing the image signals from neighboring standard photosites. It would be likewise feasible for the system to work on dynamic range from only one direction, i.e., to expand the response of only the standard photosites to increased light exposures by utilizing the image signals from neighboring non-standard photosites, or alternatively, to expand the response of only the non-standard photosites to decreased light exposures by utilizing the image signals from neighboring standard photosites.

The invention has been described in detail with particular reference to certain preferred embodiments thereof, but it will be understood that variations and modifications can be effected within the spirit and scope of the invention.

PARTS LIST 2 lens
6 optical lowpass filter
10 image sensing device
14 A/D converter
18 system controller
22 DREFA processor
26 CFA interpolator
28 non-standard photosite
30 standard photosite
32 red non-standard photosite
34 green non-standard photosite
36 blue non-standard photosite
38 red standard photosite
40 green standard photosite
42 blue standard photosite
44 non-standard compensator
46 non-standard thresholder
48 standard thresholder
50 signal extender
51 standard lenslet
52 non-standard lenslet
53 color filter array
54 metallic mask portion
55 photosensitive area
56 large aperture
57 small aperture
58 neutral density filter layer
59 non-standard neutral density filter

The invention claimed is:

1. An image capture system comprising:
    an image sensor including an array of photosites divided into standard photosites and non-standard photosites, wherein said standard photosites and said nonstandard photosites both sparsely sample said array in a predetermined pattern; and
    a system controller having a normal mode and an expanding mode, said system controller, in said normal mode, operating the image sensor with the standard photosites and the non-standard photosites having a similar response to the same light exposure, and, in said expanding mode, operating the image sensor with the standard photosites having a first response to a light exposure and the non-standard photosites having a second, slower response to the same light exposure.

2. The system of claim 1 wherein the system controller switches between said modes based upon user input.

3. The system of claim 1 wherein the system controller is capable of adjusting relative magnitudes of said first and second responses based upon user input.

4. The system of claim 1 wherein the system controller switches between said modes based upon analysis of an image signal captured by said image sensor.

5. The system of claim 1 wherein the system controller adjusts relative magnitudes of said first and second responses based upon analysis of an image signal captured by said image sensor.

* * * * *